US010164588B2

(12) United States Patent
Munenaga et al.

(10) Patent No.: US 10,164,588 B2
(45) Date of Patent: Dec. 25, 2018

(54) AUDIO AMPLIFIER CIRCUIT, AUDIO OUTPUT DEVICE USING THE SAME, AND ELECTRONIC DEVICE USING THE SAME

(71) Applicant: ROHM CO., LTD., Ukyo-ku, Kyoto (JP)

(72) Inventors: Hideki Munenaga, Kyoto (JP); Hideo Araki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/137,508

(22) Filed: Apr. 25, 2016

(65) Prior Publication Data

US 2016/0315590 A1 Oct. 27, 2016

(30) Foreign Application Priority Data

Apr. 27, 2015 (JP) ................................. 2015-090730
Mar. 22, 2016 (JP) ................................. 2016-057586

(51) Int. Cl.
| H03G 7/00 | (2006.01) |
| H03F 3/187 | (2006.01) |
| H03F 3/213 | (2006.01) |
| H04R 3/00 | (2006.01) |
| H03F 3/217 | (2006.01) |

(52) U.S. Cl.
CPC ............. *H03F 3/187* (2013.01); *H03F 3/213* (2013.01); *H03F 3/2173* (2013.01); *H03F 3/217* (2013.01); *H03F 2200/03* (2013.01); *H03F 2200/366* (2013.01); *H04R 3/007* (2013.01)

(58) Field of Classification Search
CPC .......... H03F 3/187; H03F 3/213; H03F 3/217; H03F 3/2173; H03F 2200/03; H03F 2200/366; H04R 3/007
USPC ............. 381/106, 120, 104; 330/207 A, 251; 257/288; 326/98, 97, 96, 95, 119
See application file for complete search history.

(56) References Cited

U.S. PATENT DOCUMENTS

| 2009/0051427 A1* | 2/2009 | Miyashita | H03F 1/52 330/251 |
| 2010/0244930 A1* | 9/2010 | Ogawa | H01L 27/0629 327/437 |
| 2011/0182446 A1* | 7/2011 | Shajaan | H02M 3/158 381/150 |
| 2012/0105155 A1* | 5/2012 | Odagiri | H03F 3/217 330/207 A |
| 2013/0236034 A1* | 9/2013 | Munenaga | H03F 3/2173 381/120 |

FOREIGN PATENT DOCUMENTS

JP          2001223537 A       8/2001

* cited by examiner

*Primary Examiner* — Vivian Chin
*Assistant Examiner* — Con P Tran
(74) *Attorney, Agent, or Firm* — Cantor Colburn LLP

(57) ABSTRACT

An audio amplifier circuit for driving an electro-acoustic transducer, which is bridged transless (BTL)-connected to the audio amplifier circuit, in a filterless manner, including: a class D amplifier including a high side transistor and a low side transistor; a high side driver configured to drive the high side transistor; and a low side driver configured to drive the low side transistor, as a pair, wherein the low side driver is configured so that a time for turning off the low side transistor by the low side driver is longer than that for turning off the high side transistor by the high side driver.

10 Claims, 15 Drawing Sheets

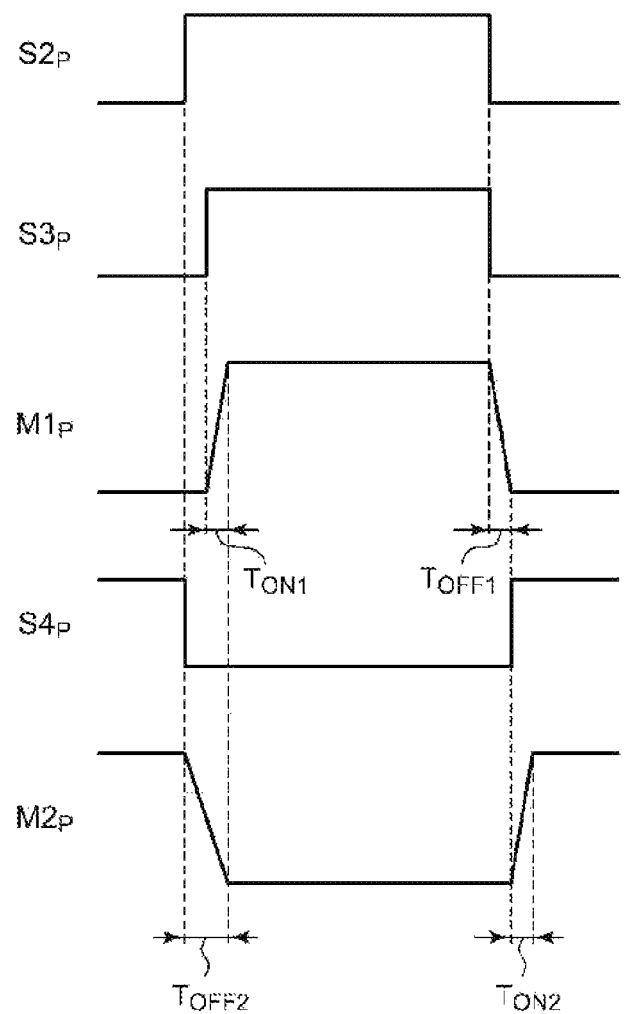

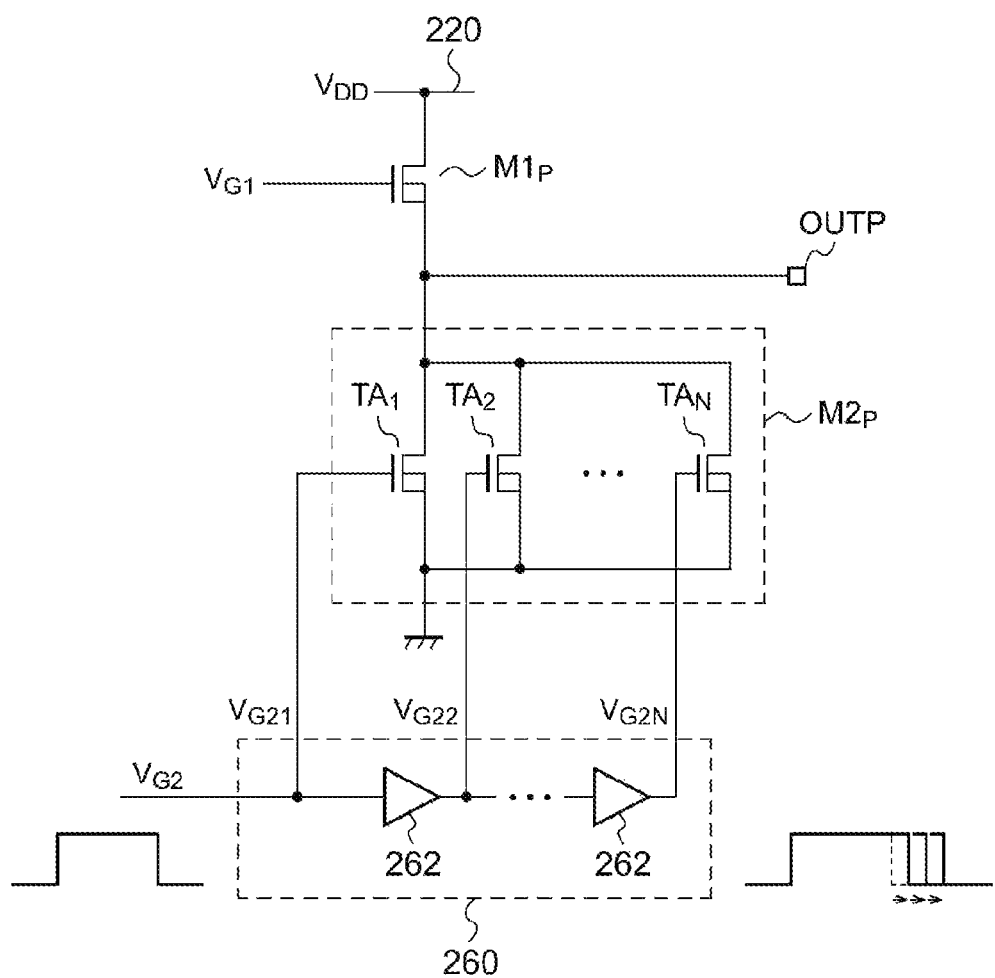

AUDIO AMPLIFIER CIRCUIT, AUDIO OUTPUT DEVICE USING THE SAME, AND ELECTRONIC DEVICE USING THE SAME

CROSS-REFERENCE TO RELATED APPLICATIONS

This application is based upon and claims the benefit of priority from Japanese Patent Application Nos. 2015-090730, filed on Apr. 27, 2015, and 2016-057586, filed on Mar. 22, 2016, the entire contents of which are incorporated herein by reference.

TECHNICAL FIELD

The present disclosure relates to an audio amplifier circuit for driving a speaker or a headphone.

BACKGROUND

An audio amplifier circuit is used to amplify a weak audio signal to drive an electro-acoustic transducer such as a speaker or a headphone. FIG. 1 is a circuit diagram of an audio output device 100r. The audio output device 100r has, in addition to an electro-acoustic transducer 102, an audio amplifier integrated circuit (IC) 200r, filters $104_P$ and $104_N$ and snubber circuits $106_P$ and $106_N$, which are configured to be symmetrical to a positive electrode and a negative electrode of the electro-acoustic transducer 102, and the electro-acoustic transducer 102 is bridged transless/bridge-tied load (BTL)-connected to the audio amplifier IC 200r.

The audio amplifier IC 200r has an OUTP terminal and an OUTN terminal. The filter $104_P$ is installed between the positive electrode terminal (+) of the electro-acoustic transducer 102 and the OUTP terminal, and the filter 104N is installed between the negative electrode terminal (−) of the electro-acoustic transducer 102 and the OUTN terminal. The filter $104_P$ and $104_N$ are primary filters each of which has a series inductor L1 and a shunt capacitor C1.

The audio amplifier IC 200r has class D amplifiers $202_P$ and $202_N$, drivers $204_P$ and $204_N$, and a pulse modulator 206. The pulse modulator 206 receives an analog or digital audio signal S1 and pulse-modulates the same to generate pulse signals $S2_P$ and $S2_N$.

The driver $204_P$ drives the class D amplifier $202_P$ according to the pulse signal $S2_P$. Similarly, the driver $204_N$ drives the class D amplifier $202_N$ according to the pulse signal $S2_N$.

FIG. 2 is a waveform view of the audio output device 100r of FIG. 1, which operates in a differential manner. In the present specification, the waveform view and the vertical axis and the horizontal axis of the time charts are appropriately enlarged and reduced to facilitate understanding of the present disclosure and also simplified to facilitate understanding of each waveform view shown.

Here, in order to facilitate understanding, a case where a triangular wave and the audio signal S1 are compared to generate pulse signals $S2_P$ and $S2_N$ will be described. In a class D amplifier based on a differential scheme, the pulse signals $S2_P$ and $S2_N$ are reverse-phased. As a result, a voltage Vo+ of the OUTP terminal and a voltage Vo− of the OUTN terminal become differential signals, so that a maximum amplitude thereof is double a source voltage $V_{DD}$ of the class D amplifiers $202_P$ and $202_N$.

In the class D amplifier based on the differential scheme, the filters $104_P$ and $104_N$ serve as low-pass filters (LPFs) for removing a switching frequency of a differential signal Vo to reproduce the original audio signal S1.

Recently, a filterless scheme has been employed in the place of the class D amplifier based on the differential scheme described with reference to FIG. 2. FIG. 3 is a waveform view of the audio output device 100r operating in a filterless manner. In a filterless operation, the audio signal S1 and a triangular wave are compared to generate a pulse signal $S2_P$, and an inverted signal #S1 of the audio signal S1 and a triangular wave are compared to generate a pulse signal $S2_N$. In this filterless scheme, an amplitude of the differential signal Vo applied to the electro-acoustic transducer 102 is ½ of that of the differential scheme of FIG. 1, but the LPFs for removing a switching frequency are not required. However, in order to suppress an unnecessary electromagnetic interference (EMI), the filters cannot be removed, and in the filterless scheme, the filters $104_P$ and $104_N$ serve as EMI removal filters.

When the audio output device 100r of FIG. 1 is operated in a filterless manner, in a state where there is a big difference between duty ratios of the OUTP and OUTN, that is, in a state where a current of the electro-acoustic transducer 102 is large, the output voltages Vo+ and Vo− overshoot. In order to suppress overshoot, the snubber circuits $106_P$ and $106_N$ are additionally required for each of the OUTP and OUTN terminals, which causes an increase in the number of components of the circuit.

SUMMARY

The present disclosure provides some embodiments of an audio output device capable of suppressing overshoot through the use of an approach different from the snubber circuits.

According to one embodiment of the present disclosure, there is provided an audio amplifier circuit for driving an electro-acoustic transducer, which is bridged transless (BTL)-connected to the audio amplifier circuit, in a filterless manner. The audio amplifier circuit includes: a class D amplifier including a high side transistor and a low side transistor; a high side driver configured to drive the high side transistor; and a low side driver configured to drive the low side transistor, as a pair. The low side driver is configured so that a time for turning off the low side transistor by the low side driver is longer than that for turning off the high side transistor by the high side driver.

According to this embodiment, it is possible to suppress overshoot by lengthening a turn-off time of the low side transistor.

Each of the high side transistor and the low side transistor may be an NMOS transistor. The high side transistor may include a first PMOS transistor and a first NMOS transistor. The low side transistor may include a second PMOS transistor and a second NMOS transistor. An on-resistance of the second NMOS transistor may be higher than that of the first NMOS transistor.

According to this embodiment, it is possible to suppress overshoot. In addition, it is unnecessary to increase a circuit area.

The on-resistance of the second NMOS transistor may be 1.2 to 2 times that of the first NMOS transistor.

Thus, it is possible to suppress overshoot, while maintaining responsiveness. Also, it is unnecessary to increase a circuit area.

According to another embodiment of the present disclosure, there is provided an audio amplifier circuit. The audio amplifier circuit includes: a class D amplifier including a high side transistor and a low side transistor; a high side driver configured to drive the high side transistor; and a low side driver configured to drive the low side transistor, as a pair. The low side driver is configured so that a time for turning off the low side transistor by the low side driver is longer than that for turning on the low side transistor.

According to this embodiment, it is possible to suppress overshoot.

The low side transistor may include a second PMOS transistor and a second NMOS transistor. An on-resistance of the second NMOS transistor may be higher than that of the second PMOS transistor.

The on-resistance of the second NMOS transistor may be 1.2 to 2 times that of the second PMOS transistor.

According to still another embodiment of the present disclosure, there is provided an audio amplifier circuit for driving an electro-acoustic transducer, which is bridged transless (BTL)-connected to the audio amplifier circuit, in a filterless manner. The audio amplifier circuit includes a pair of class D amplifiers, each of the class D amplifiers including a high side transistor and a low side transistor. The low side transistor is divided into a plurality of transistor areas having independent control terminals, and the plurality of transistor areas is turned off sequentially.

The audio amplifier circuit may further include a delay circuit configured to delay a negative edge of a control signal of each of the transistor areas. At least a part of the plurality of transistor areas may be sequentially turned off during a period when a current flows in a parasitic capacitance connected to the high side transistor and the low side transistor.

The audio amplifier circuit may be integrated in a single semiconductor substrate.

The term "integrated" may include a case in which all the components of a circuit are formed on a semiconductor substrate or a case in which major components of a circuit are integrated, and some resistors, capacitors, or the like may be installed outside the semiconductor substrate in order to adjust circuit constants.

By integrating the circuit in the single chip, it is possible to reduce a circuit area and also to uniformly maintain the characteristics of a circuit element.

According to still another embodiment of the present disclosure, there is provided an audio output device. The audio output device includes: an electro-acoustic transducer; and any one of the audio amplifier circuits as described above, configured to drive the electro-acoustic transducer, wherein no snubber circuit is connected between the audio amplifier circuit and the electro-acoustic transducer.

According to this embodiment, since no snubber circuit is required, it is possible to reduce costs and mounting area of circuit components.

According to still another embodiment of the present disclosure, there is provided an electronic device. The electronic device includes: an electro-acoustic transducer; and the audio amplifier circuit of any one of the audio amplifier circuits as described above, configured to drive the electro-acoustic transducer, wherein no snubber circuit is connected between the audio amplifier circuit and the electro-acoustic transducer.

Also, arbitrarily combining the foregoing components or converting the expression of the present disclosure among a method, an apparatus, and the like is also effective as an embodiment of the present disclosure.

BRIEF DESCRIPTION OF THE DRAWINGS

FIG. 5B is a waveform view illustrating turn-on and turn-off operations of each of a high side transistor and a low side transistor of an audio output device according to an embodiment.

FIG. 10 is a circuit diagram illustrating an audio output device according to a fourth modification.

DETAILED DESCRIPTION

Figure 1:
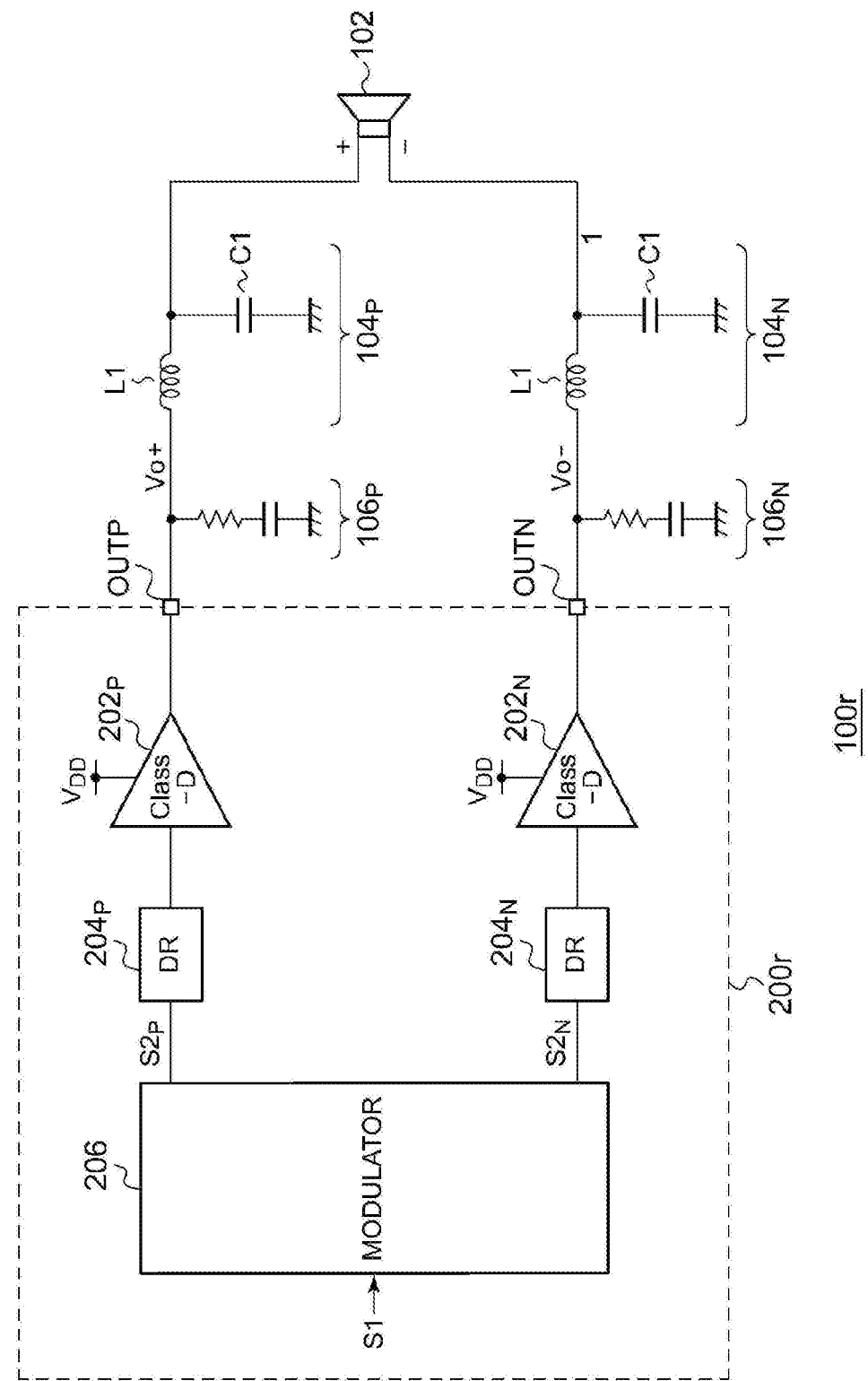
FIG. 1 is a circuit diagram of an audio output device.

Embodiments of the present disclosure will be now described in detail with reference to the drawings. Like or equivalent components, members, and processes illustrated in each drawing are given like reference numerals and a repeated description thereof will be properly omitted. Also, the embodiments are presented by way of example only, and are not intended to limit the present disclosure, and any feature or combination thereof described in the embodiments may not necessarily be essential to the present disclosure.

In the present disclosure, "a state where a member A is connected to a member B" includes a case where the member A and the member B are physically directly connected or even a case in which the member A and the member B are indirectly connected through any other member that does not affect an electrical connection state thereof.

Similarly, "a state where a member C is installed between a member A and a member B" also includes a case where the member A and the member C or the member B and the member C are indirectly connected through any other member that does not affect an electrical connection state, in addition to a case in which the member A and the member C or the member B and the member C are directly connected.

Figure 4:
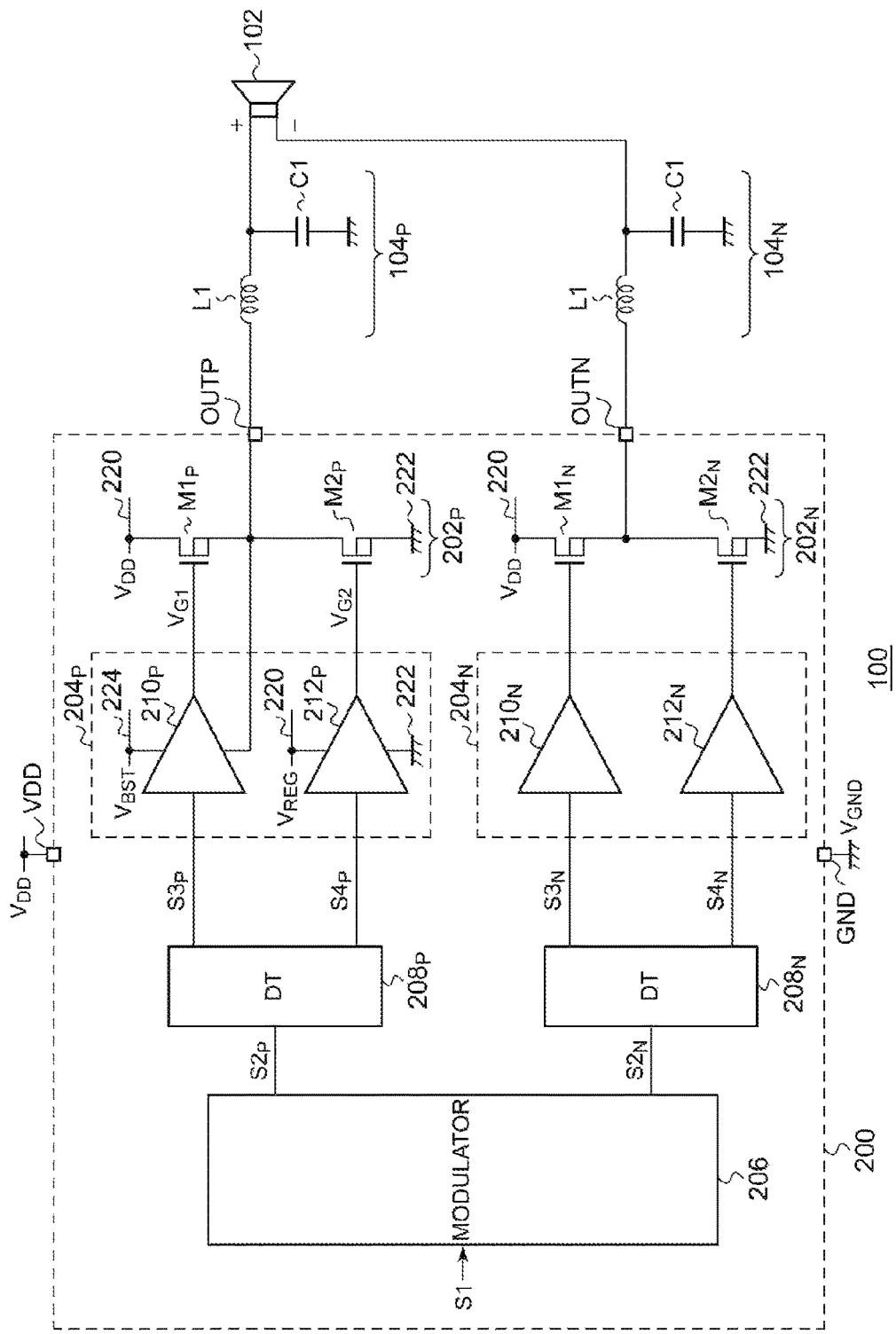
FIG. 4 is a circuit diagram illustrating a configuration of an audio output device according to an embodiment.

FIG. 4 is a circuit diagram illustrating a configuration of an audio output device 100 according to an embodiment.

The audio output device 100 has an electro-acoustic transducer 102, filters $104_P$ and $104_N$, and an audio amplifier IC 200. The audio amplifier IC 200 is a functional IC integrated in a single semiconductor substrate and has output terminals OUTP and OUTN, a power (VDD) terminal, and a ground (GND) terminal A source voltage $V_{DD}$ is supplied to the VDD terminal and a ground voltage $V_{GND}$ is supplied to the GND terminal.

The electro-acoustic transducer 102 is BTL-connected to the audio amplifier IC 200. A voltage V+ of the OUTP terminal of the audio amplifier IC 200 is applied to a positive terminal (+) of the electro-acoustic transducer 102 through the filter $104_P$, and a voltage V− of the OUTN terminal of the audio amplifier IC 200 is applied to a negative terminal (−) thereof through the filter 104$_N$.

The filters 104$_P$ and 104$_N$ are primary LPFs each of which includes a shunt capacitor C1 and a series inductor L1, and mainly provided to suppress unnecessary radiation. In applications in which unnecessary radiation is out of the question, the filters 104$_P$ and 104$_N$ may be omitted as the name of the filterless scheme suggests. The series inductor L1 of each of the filters 104$_P$ and 104$_N$ may be a common mode choke coil wound around a common core.

The audio amplifier IC 200 drives the electro-acoustic transducer 102 BTL-connected between the OUTP and OUTN terminals in a filterless manner. The audio amplifier IC 200 includes a class D amplifier 202, a driver 204, a pulse modulator 206, and a dead time generation circuit 208. The class D amplifier 202, the driver 204, and the dead time generation circuit 208 are installed as a pair for each of the output terminals OUTP and OUTN. A subscript P is attached to the circuits of the OUTP side, and a subscript N is attached to the circuits of the OUTN side. The P side and the N side are configured in the same manner, and therefore, the subscripts will be omitted in the following description.

The class D amplifier 202 includes a high side transistor M1 and a low side transistor M2 installed in series between the power line 220 and the ground line 222. In this embodiment, the high side transistor M1 and the low side transistor M2 are all N-channel power MOSFETs. A drain of the high side transistor M1 is connected with the power line 220 and a source thereof is connected with a corresponding output terminal OUTP/OUTN. A drain of the low side transistor M2 is connected with a corresponding output terminal OUTP/OUTN and a source thereof is connected with the ground line 222.

The driver 204 drives the corresponding class D amplifier 202. The driver 204 has a high side driver 210 for driving the high side transistor M1 and a low side driver 212 for driving the low side transistor M2.

The pulse modulator 206 generates pulse signals S2$_P$ and S2$_N$ for operating the class D amplifiers 202$_P$ and 202$_N$ in a filterless manner. A configuration of the pulse modulator 206 is not particularly limited and a known circuit may be used.

As a basic operation, the high side driver 210 and the low side driver 212 complimentarily turn on and off the high side transistor M1 and the low side transistor M2 according to the corresponding pulse signal S2. However, when the high side transistor M1 and the low side transistor M2 are simultaneously turned on, a through current flows to degrade efficiency. Thus, the dead time generation circuit 208 inserted between the pulse modulator 206 and the driver 204 inserts a dead time into the pulse signal S2 and generates a gate driving signal S3 for the high side and a gate driving signal S4 for the low side.

The high side driver 210 switches the high side transistor M1 according to the gate driving signal S3 and the low side driver 212 switches the low side transistor M2 according to the gate driving signal S4. Further, in order to turn on the high side transistor M1 of the N-channel MOSFET, a power terminal at an upper side of the high side driver 210 is connected with a boot strap line 224. A boot strap voltage V$_{BST}$ generated by a boot strap circuit (not shown) is supplied to the boot strap line 224. The boot strap voltage V$_{BST}$ is V$_{BST}$≈V$_{OUT}$+V$_{REG}$. V$_{REG}$ is a DC voltage which is internally generated in the audio amplifier IC 200 or which is supplied from the outside, and V$_{OUT}$ is a voltage of an OUT terminal.

Next, a configuration for suppressing overshoot will be described. In this embodiment, a turn-off time T$_{OFF2}$ of the low side transistor M2 by the low side driver 212 is intentionally designed to be longer than an existing turn-off time.

Figure 5A:
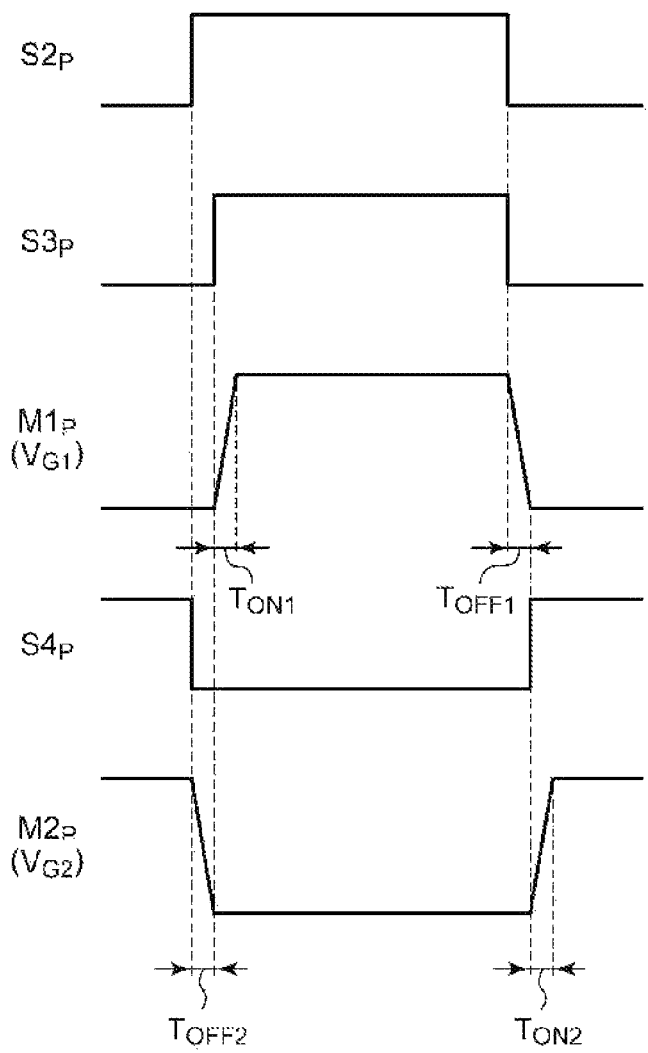
FIG. 5A is a waveform view illustrating turn-on and turn-off of each of a high side transistor and a low side transistor of the related art audio output device.

FIG. 5A is a waveform view illustrating turn-on and turn-off of each of the high side transistor M1 and the low side transistor M2 of the related art audio output device, and FIG. 5B is a waveform view illustrating turn-on and turn-off operations of each of the high side transistor M1 and the low side transistor M2 of the audio output device according to an embodiment. A P pole side and an N pole side are configured to be the same, and therefore, only an operation of the P pole side is illustrated.

As illustrated in FIG. 5A, in the related art, a turn-on time T$_{ON1}$ and a turn-off time T$_{OFF1}$ of the high side transistor M1 and a turn-on time T$_{ON2}$ and a turn-off time T$_{OFF2}$ of the low side transistor M2 were all designed to be the same.

In contrast, in this embodiment, as illustrated in FIG. 5B, the turn-off time T$_{OFF2}$ of the low side transistor M2 by the low side driver 212 is designed to be longer than the turn-off time T$_{OFF1}$ of the high side transistor M1 by the high side driver 210 and the turn-on time T$_{ON2}$ of the low side transistor M2 by the low side driver 212.

The turn-on time T$_{ON1}$ of the high side transistor M1 is a time from when the high side transistor M1 is in an OFF state until the high side transistor M1 is fully turned on, and is shortened as a slew rate (slope) at which a gate voltage (gate-source voltage) V$_{G1}$ thereof is increased is higher. The turn-on time T$_{ON1}$ corresponds to a rise time T$_{R1}$ of the gate voltage V$_{G1}$.

The turn-off time T$_{OFF1}$ of the high side transistor M1 is a time from when the high side transistor M1 is in a fully ON state until the high side transistor M1 is turned off, and is shortened as a slew rate (slope) at which the gate voltage V$_{G1}$ thereof is decreased is higher. The turn-off time T$_{OFF1}$ corresponds to a fall time T$_{F1}$ of the gate voltage V$_{G1}$.

The turn-on time T$_{ON2}$ of the low side transistor M2 is a time from when the low side transistor M2 is in an OFF state until the low side transistor M2 is fully turned on, and is shortened as a slew rate (slope) at which the gate voltage (gate-source voltage) V$_{G2}$ thereof is increased is higher. The turn-on time T$_{ON2}$ corresponds to a rise time T$_{R2}$ of the gate voltage V$_{G2}$.

The turn-off time T$_{OFF2}$ of the low side transistor M2 is a time from when the low side transistor M2 is in a fully ON state until the low side transistor M2 is turned off, and is shortened as a slew rate (slope) at which the gate voltage V$_{G2}$ thereof is decreased is higher. The turn-off time T$_{OFF2}$ corresponds to a fall time T$_{F2}$ of the gate voltage V$_{G2}$.

To sum up, in the related art, the following relationship is established.

$$T_{ON1}=T_{ON2}=T_{OFF1}=T_{OFF2}$$

In contrast, in the embodiment, the following relationship is established.

$$T_{ON1}=T_{ON2}=T_{OFF1}<T_{OFF2}$$

The configuration of the audio output device 100 has been described above. Subsequently, an operation thereof will be described.

First, the reason why overshoot occurs in the audio output device 100 will be described.

Figure 6:
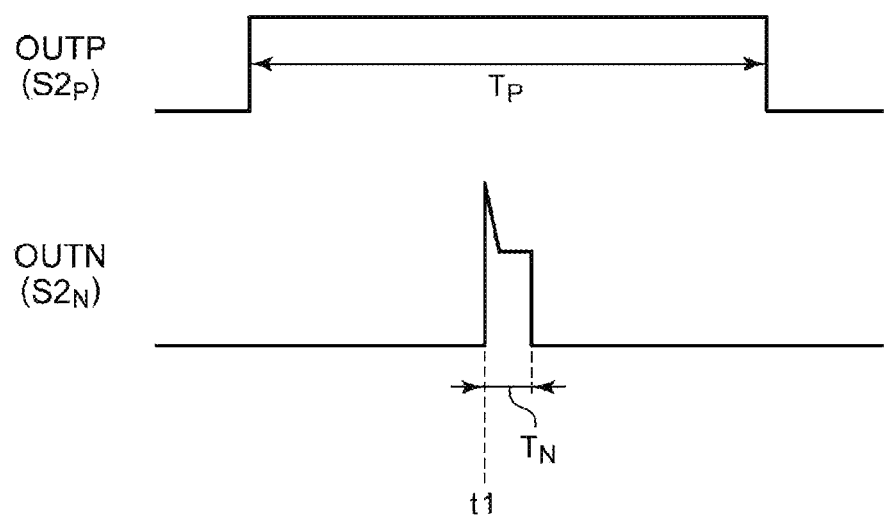
FIG. 6 is a waveform view of OUTP and OUTN terminals when overshoot occurs.

FIG. 6 is a waveform view of the OUTP and OUTN terminals when overshoot occurs. Overshoot occurs at the OUTN terminal at a time t1 at which the OUTN terminal transitions from a low level to a high level.

Figure 3:
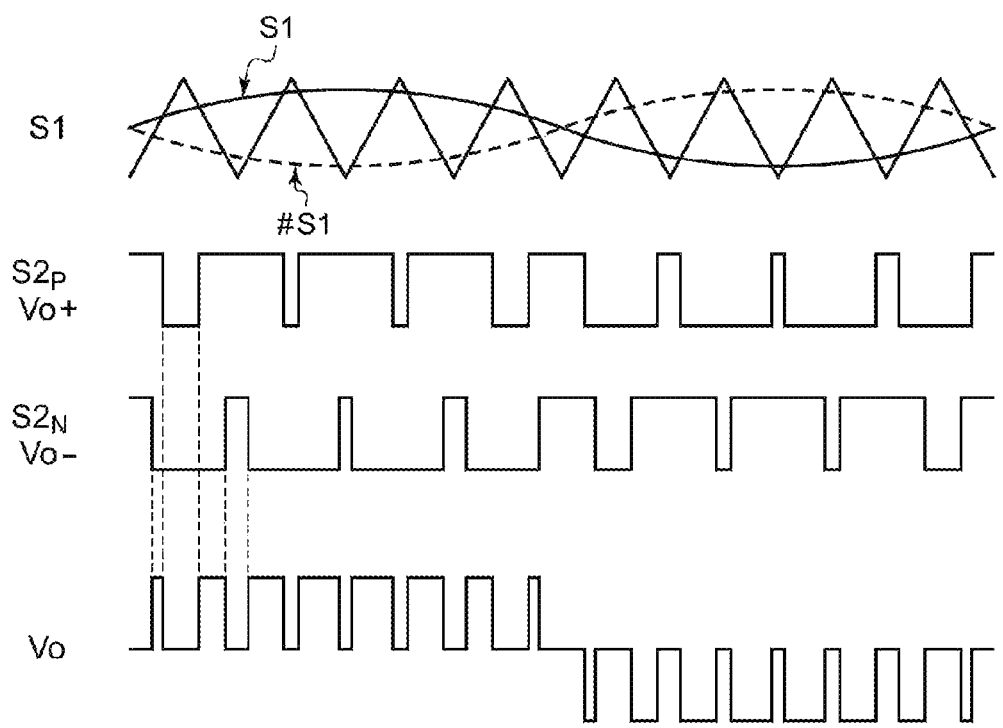
FIG. 3 is a waveform view of an audio output device operating in a filterless manner.

The overshoot remarkably occurs particularly when an absolute value of the audio signal S1 is large in the waveform view of FIG. 3, that is, when a difference between a pulse width $T_P$ of the OUTP side and a pulse width $T_N$ of the OUTN side is large. When the relationship between the OUTP and OUTN is reversed, overshoot occurs in the OUTP terminal side.

Figure 7A:
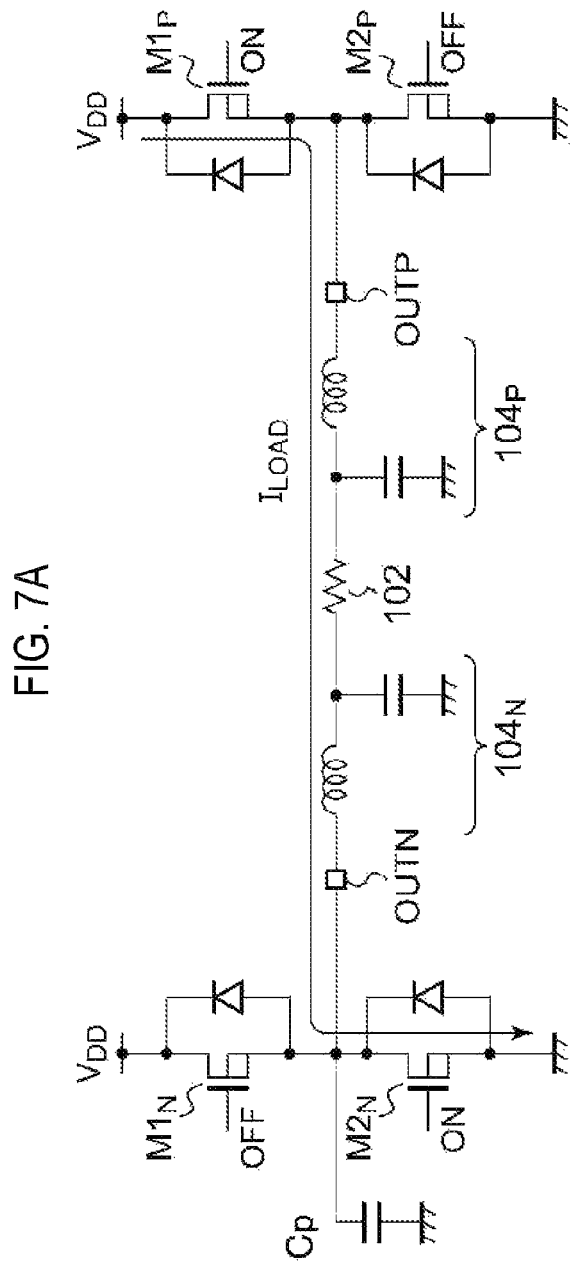
FIGS. 7A to 7C are views illustrating a state of a class D amplifier when overshoot occurs.
Figure 7B:
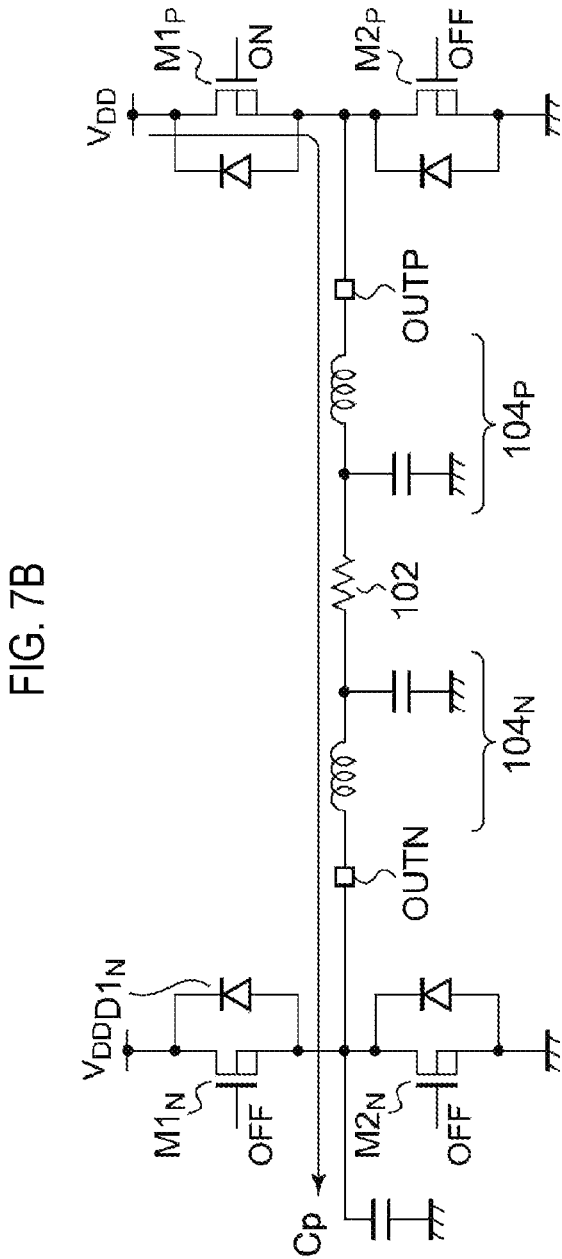
Figure 7C:
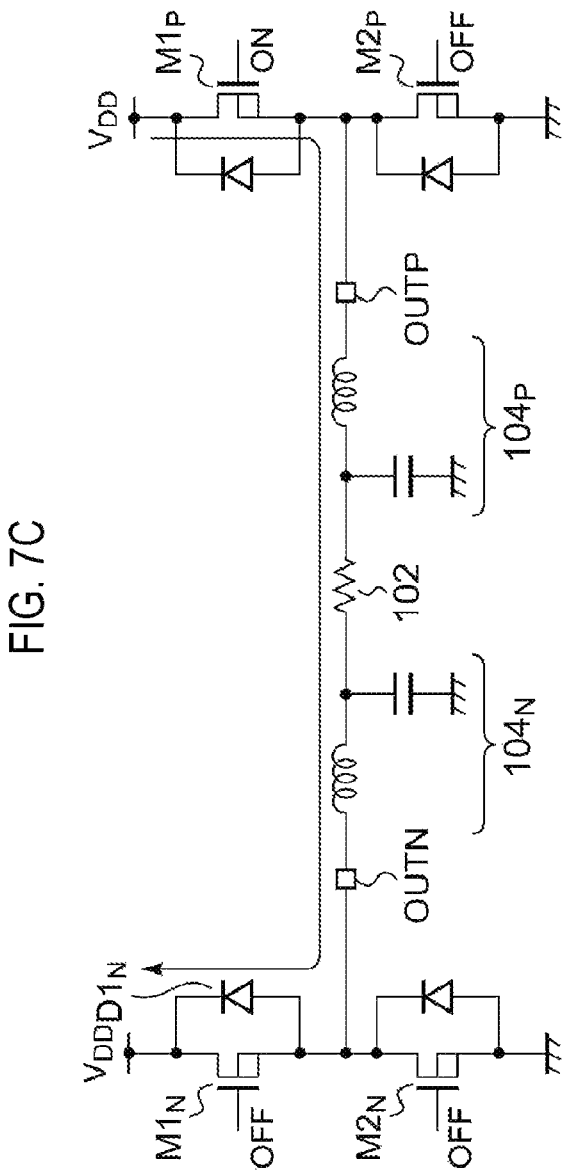

FIGS. 7A to 7C are views illustrating a state of the class D amplifier when overshoot occurs. FIG. 7A illustrates a state immediately before a time t1 and FIGS. 7B and 7C illustrate a state of a dead time immediately after the time t1. In FIG. 7A, a load current $I_{LOAD}$ flowing in the electro-acoustic transducer 102 flows along a path of the high side transistor $M1_P$, the electro-acoustic transducer 102, and the low side transistor $M2_N$, and thus, energy is accumulated in the filter 104 and the electro-acoustic transducer 102 according to the load current $I_{LOAD}$.

In FIG. 7B, when the low side transistor $M2_N$ is rapidly turned off, the OUTN terminal has high impedance and the load current $I_{LOAD}$ flowing in the electro-acoustic transducer 102 until that time flows to the parasitic capacitance $C_p$ connected to the OUTN terminal. Then, as illustrated in FIG. 7C, the load current $I_{LOAD}$ flows along the path of the high side transistor $M1_P$, the electro-acoustic transducer 102, and a body diode $D1_N$ of the low side transistor $M2_N$. At this time, overshoot occurs.

Here, in the audio output device 100 according to the embodiment, a turn-off time $T_{OFF2}$ of the low side transistor $M2_N$ is configured to be longer than that in the existing case, that is, than the turn-on times $T_{ON1}$ and $T_{ON2}$, and the other turn-off time $T_{OFF1}$.

Thus, a transition time from FIG. 7A to FIG. 7C is lengthened more than that of the existing case. During this transition time, the load current $I_{LOAD}$ flows to the low side transistor $M2_N$ in which a resistance value of a channel is gradually increased, so that, a current amount thereof is reduced over time. Further, the high side transistor M1 is turned on in a state where the load current $I_{LOAD}$ is reduced to a degree, thereby suppressing overshoot.

The operation of the audio output device 100 has been described above. According to this audio output device 100, it is possible to suppress overshoot by designing the turn-off time $T_{OFF2}$ of the low side transistor M2 to be lengthened.

In addition, since it is unnecessary to connect snubber circuits to the OUTP and OUTN terminals, costs can be reduced.

Figure 2:
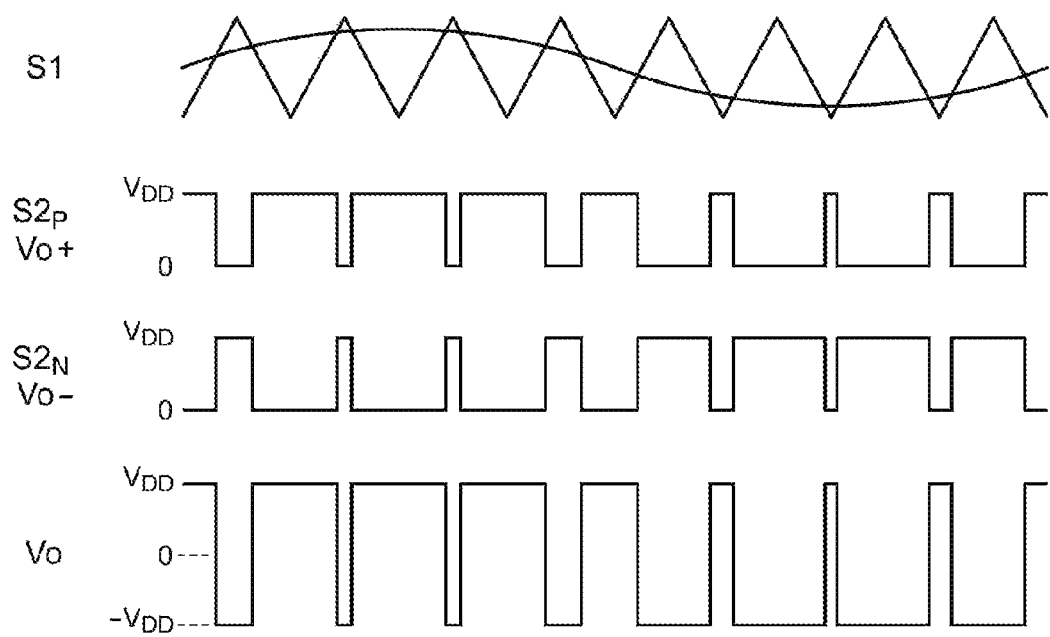
FIG. 2 is a waveform view of the audio output device of FIG. 1 which operates in a differential manner.

The present disclosure may be recognized with the circuit diagram of FIG. 2 or cover various device circuits derived from the above description, but is not limited to the specific configuration. Hereinafter, a more specific configuration example will be described to easily understand and clarify the essence of the present disclosure and a circuit operation thereof, rather than to narrow the scope of the present disclosure.

Figure 8:
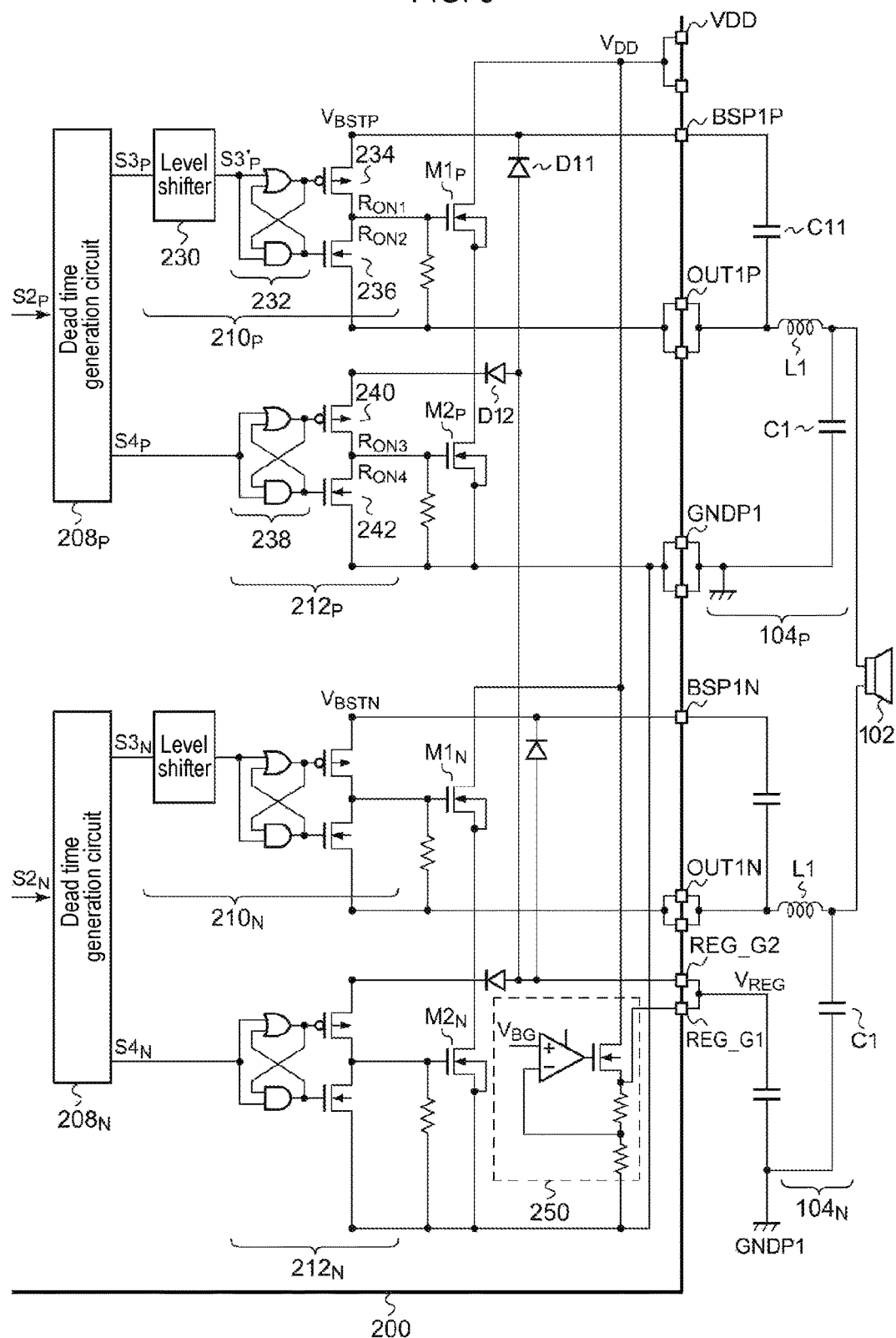
FIG. 8 is a circuit diagram illustrating a configuration example of an audio amplifier IC.

FIG. 8 is a circuit diagram illustrating a configuration example of the audio amplifier IC 200. Since the OUTP and OUTN sides are configured to be the same, only a configuration of the OUTP side will be described herein.

The high side driver $210_P$ includes a level shifter 230, a first logic circuit 232, a first PMOS transistor 234, and a first NMOS transistor 236.

The first PMOS transistor 234 is installed between a bootstrap BSP1P terminal and a gate of the high side transistor $M1_P$, and the first NMOS transistor 236 is installed between a gate and a source of the high side transistor $M1_P$.

The level shifter 230 level-shifts a gate driving signal $S3_P$ output from the dead time generation circuit $208_P$. The first logic circuit 232 controls a gate signal of each of the first PMOS transistor 234 and the first NMOS transistor 236 according to a level-shifted gate driving signal $S3_P'$. The first logic circuit 232 is configured such that the first PMOS transistor 234 and the first NMOS transistor 236 are not simultaneously turned on. Specifically, when one of the two transistors is instructed to be turned on, the first logic circuit 232 turns the other transistor off and then turns the one transistor on.

An AND gate of the first logic circuit 232 receives the gate driving signal $S3_P'$ and a gate signal of the first PMOS transistor 234 to output the received signals to the gate of the first NMOS transistor 236. When the gate driving signal $S3_P'$ has a high level, by the AND gate, the gate signal of the first PMOS transistor 234 has a high level, that is, the first PMOS transistor 234 is turned off, and thereafter, a gate signal of the first NMOS transistor 236 has a high level and the first NMOS transistor 236 is turned on.

An OR gate of the first logic circuit 232 receives the gate driving signal $S3_P'$ and the gate signal of the first NMOS transistor 236 to output the received signals to the gate of the first PMOS transistor 234. When the gate driving signal $S3_P'$ has a low level, by the OR gate, the gate signal of the first NMOS transistor 236 has a low level, that is, the first NMOS transistor 236 is turned off, and thereafter, a gate signal of the first PMOS transistor 234 has a low level and the first PMOS transistor 234 is turned on.

A linear regulator 250 generates a stabilized DC voltage $V_{REG}$. The DC voltage $V_{REG}$ is connected with the BSP1P terminal through a diode D11. The diode D11 and a capacitor C11 form a bootstrap circuit, and generate a bootstrap voltage $V_{BSTP}=(V_{REG}-Vf)+(V_{DD})$ at the BSP1P terminal Vf is a forward voltage of the diode D11.

The low side driver $212_P$ includes a second logic circuit 238, a second PMOS transistor 240, and a second NMOS transistor 242. A DC voltage $V_{REG}$ is supplied to a source of the second PMOS transistor 240 through a diode D12. A drain of the second PMOS transistor 240 is connected with a gate of the low side transistor $M2_P$. The second NMOS transistor 242 is installed between the gate of the low side transistor $M2_P$ and a ground line.

The second logic circuit 238 controls a gate signal of each of the second PMOS transistor 240 and the second NMOS transistor 242 according to a gate driving signal $S4_P$. Specifically, the second logic circuit 238 is configured such that the second PMOS transistor 240 and the second NMOS transistor 242 are not simultaneously turned on. A configuration and an operation of the second logic circuit 238 are the same as those of the first logic circuit 232.

As described above, in the embodiment, the following relationship is established.

$$T_{ON1}=T_{ON2}=T_{OFF1}<T_{OFF2}$$

To this end, an on-resistance $R_{ON4}$ of the second NMOS transistor 242 is higher than an on-resistance $R_{ON2}$ of the first NMOS transistor 236. The on-resistance $R_{ON4}$ of the second NMOS transistor 242 may be about K=1.2 to 2 times the on-resistance $R_{ON2}$ of the first NMOS transistor 236. For example, the on-resistance $R_{ON4}$ may be 1.4 times greater. A size (gate width W) of the second NMOS transistor 242 is 1/K times that of the first NMOS transistor 236.

Also, the on-resistance $R_{ON4}$ of the second NMOS transistor 242 is higher than an on-resistance $R_{ON3}$ of the second PMOS transistor 240. The on-resistance $R_{ON4}$ of the second NMOS transistor 242 may be about 1.2 to 2 times the on-resistance of the second NMOS transistor 240. For example, the on-resistance $R_{ON4}$ may be 1.4 times greater.

In this embodiment, the on-resistances $R_{ON1}$ to $R_{ON4}$ of the first PMOS transistor 234, the first NMOS transistor 236, the second PMOS transistor 240, and the second NMOS transistor 242 satisfy the following relationship.

$$R_{ON1}=R_{ON2}=R_{ON3}<R_{ON4}$$

Figure 9A:
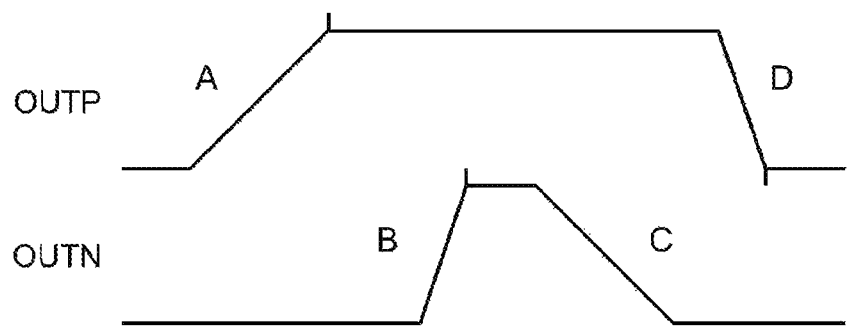
FIG. 9A is a voltage waveform view of OUTP and OUTN terminals.
Figure 9B:
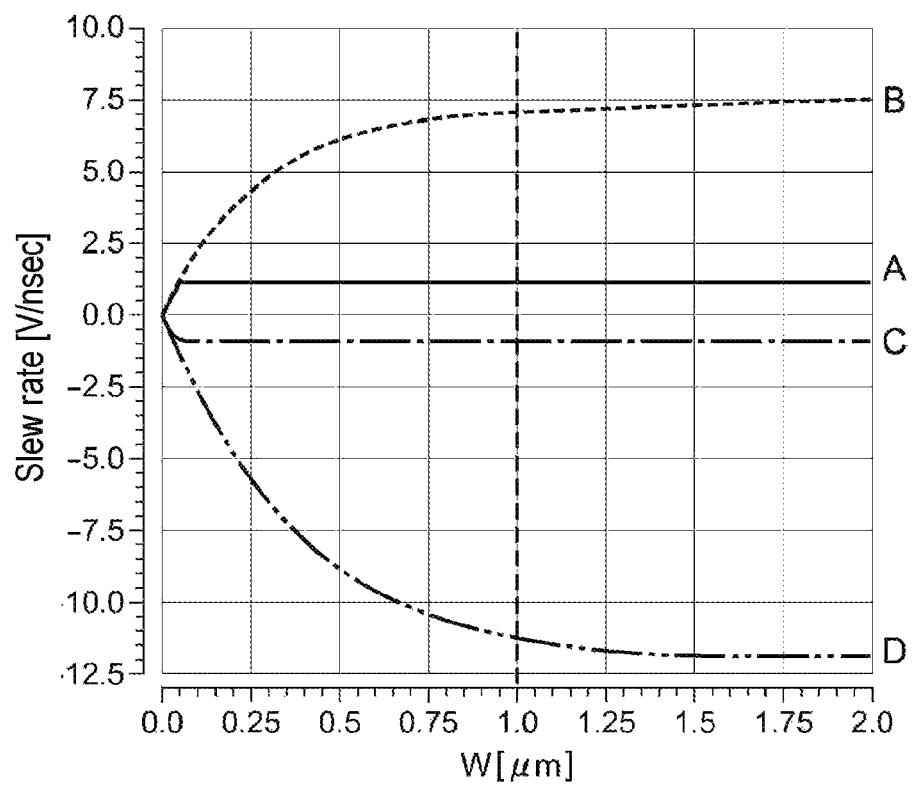
FIG. 9B is a view illustrating a simulation result of a relationship between a gate width W of a low side transistor M2 and a slew rate.

FIG. 9A is a voltage waveform view of the OUTP and OUTN terminals, and FIG. 9B is a view illustrating a simulation result of a relationship between a gate width W of the low side transistor M2 and a slew rate.

The slope A of FIG. 9A represents a rise of OUTP, the slope B represents a rise of OUTN, the slope C represents a fall of OUTN, and the slope D represents a fall of OUTP. FIG. 9B illustrates a relationship between a gate width W of the low side transistor M2 and a slew rate (slope) of each of the slopes A to D.

When W=1 μm, $R_{ON1}=R_{ON2}=R_{ON3}=R_{ON4}$. When the gate width W of the second NMOS transistor 242 is small, a turn-off time $T_{OFF2}$ of the low side transistor M2 is lengthened and a slew rate of the rising slope B of OUTN is reduced. A slew rate of the fall slope D of OUTP is the same. Meanwhile, the gate width W of the second NMOS transistor 242 does not affect the slopes A and C.

According to this audio amplifier IC 200, the turn-off time $T_{OFF2}$ of the low side transistor M2 may be longer than other turn-off time $T_{OFF1}$ and the turn-on times $T_{ON1}$ and $T_{ON2}$, and thus, overshoot can be suppressed.

In order to lengthen the turn-off time $T_{OFF2}$ of the low side transistor M2, a method of increasing a resistance component which is in series to the second NMOS transistor 242, as well as reducing a size of the element of the second NMOS transistor 242, is considered. Also, there is an advantage that a circuit area is not increased in the former employed in FIG. 8.

The present disclosure has been described above based on the embodiment. It is to be understood by those skilled in the art that the embodiment is merely illustrative and may be variously modified by any combination of the components or processes, and the modifications are also within the scope of the present disclosure. Hereinafter, some modifications will be described.

(First Modification)

The embodiment is designed to satisfy the following relationship, but the present disclosure is not limited thereto.

$$T_{ON1}=T_{ON2}=T_{OFF1}<T_{OFF2}$$

Even though the turn-off time $T_{OFF1}$ of the high side transistor M1 is lengthened, it does not contribute to a reduction of overshoot and nor have shortcomings. Thus, it may be designed to satisfy the following equation in consideration of symmetry of the circuit.

$$T_{ON1}=T_{ON2}<T_{OFF1}=T_{OFF2}$$

In this case, it may be designed to satisfy the following relationship in the circuit diagram of FIG. 8.

$$R_{ON1}=R_{ON3}<R_{ON2}=R_{ON4}$$

(Second Modification)

A method of lengthening a turn-off time of the low side transistor M2 is not limited to a reduction in the size of the second NMOS transistor 242. For example, a length of wiring connected to the source or drain of the second NMOS transistor 242 may be lengthened or a width of the wiring may be reduced, or the number of bonding wires may be reduced or the bonding wires may be lengthened. That is, a serial resistance component of the second NMOS transistor 242 may be increased.

(Third Modification)

In the embodiment, the high side transistor M1 of the power line 220 is configured as the N-channel MOSFET, but it may be a P-channel MOSFET. In this case, the bootstrap circuit is not necessary.

(Fourth Modification)

FIG. 10 is a circuit diagram illustrating an audio output device 100a according to a fourth modification. In this modification, the low side transistor $M2_P$ is configured such that a control terminal (gate) is divided into a plurality of (N) independent transistor areas $TA_1$ to $TA_N$. When the low side transistor $M2_P$ is turned off, the plurality of transistor areas $TA_1$ to $TA_N$ is sequentially turned off with a time interval. When the low side transistor $M2_P$ is turned on, the plurality of transistor areas $TA_1$ to $TA_N$ may be simultaneously turned on.

The audio output device 100a includes a delay circuit 260 which gives a delay for each of gate signals $V_{G21}$ to $V_{G2N}$ of the plurality of transistor areas $TA_1$ to $TA_N$. The delay circuit 260 does not delay positive edges of the gate signals $V_{G21}$ to $V_{G2N}$. The delay circuit 260 merely delays negative edges of the gate signals $V_{G21}$ to $V_{G2N}$.

A configuration of the delay circuit 260 is not particularly limited. For example, the delay circuit 260 includes a plurality of delay elements 262 connected in series, and is configured such that the gate signals $V_{G21}$ to $V_{G2N}$ are drawn out from taps corresponding to outputs of the respective delay elements 262. A delay amount of each of the delay elements 262 may be set such that the plurality of transistor areas $TA_1$ to $TA_N$ is sequentially turned off in a charge phase of the parasitic capacitance $C_P$ illustrated in FIG. 7B. The delay circuit 260 may be integrated with the low side driver $212_P$.

A configuration of the low side transistor $M2_N$ is the same as those of the low side transistor $M2_P$.

Figure 11:
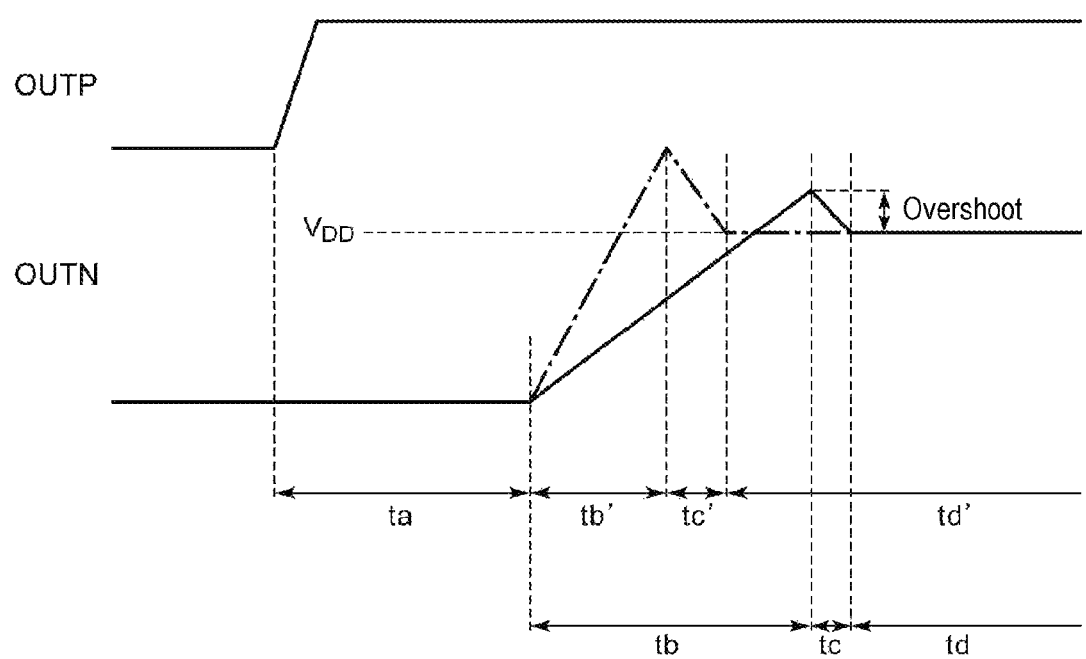
FIG. 11 is a waveform view of the audio output device of FIG. 10.

FIG. 11 is a waveform view of the audio output device 100a of FIG. 10. For comparison, a waveform view of the audio output device 100 of FIG. 4 is illustrated in FIG. 10 by a dashed line. The periods ta, tb, and tc correspond to the period illustrated in FIGS. 7A to 7C, respectively. In the audio output device 100a of FIG. 10, during the period tb, the low side transistor $M2_P$ is not rapidly turned off. Instead, the transistor areas $TA_1$ to $TA_N$ of the low side transistor $M2_P$ are sequentially turned off. Thus, after the parasitic capacitance $C_P$ is charged, the current flowing to the body diode D1 of the high side transistor $M1_P$ can be decreased and also the overshoot can be reduced.

Further, in the audio output device 100 of FIG. 4, it is necessary to carefully design the slope (slew rate) of the gate signal of the low side transistor M2 such that a through current due to simultaneous turning on of the high side transistor M1 and the low side transistor M2 is prevented from flowing. In contrast, in the configuration of dividing the low side transistor M2, even if the through current flows, the through current flows in some parts of the transistor areas $TA_1$ to $TA_N$, not the entirety of the low side transistor M2. That is, since the impedance of the path of the through current is increased, the amount of the through current can be reduced. This provides an advantage that the timing can be simply cared for.

(Applications)

Figure 12A:
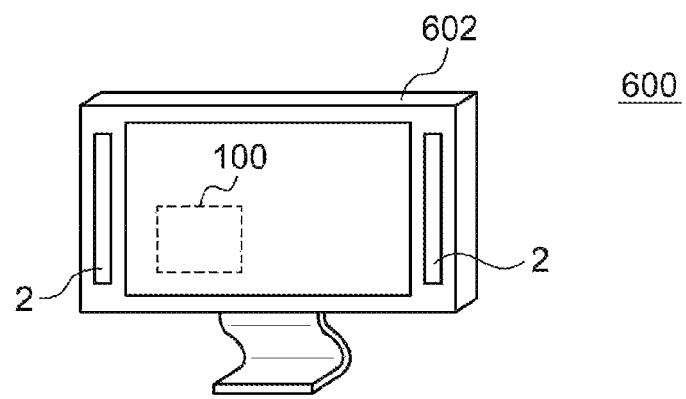
FIGS. 12A to 12C are external views of an electronic device.
Figure 12B:
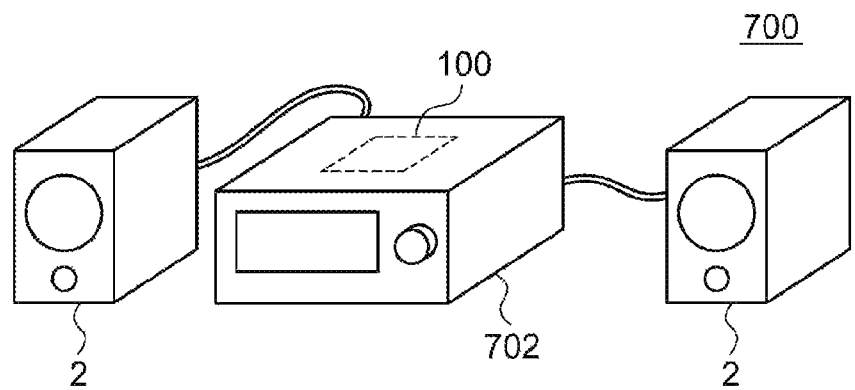
Figure 12C:
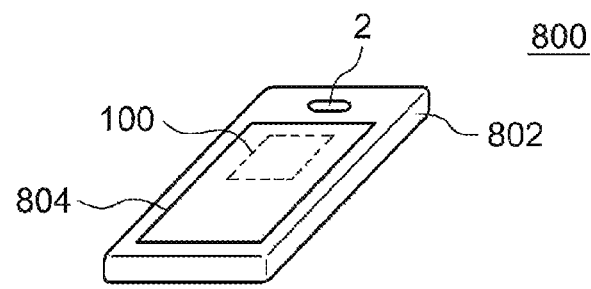

Finally, applications of the audio output device 100 will be described. FIGS. 12A to 12C are external view of an electronic device. FIG. 12A is a display device 600, which is an example of the electronic device. The display device 600 includes a housing 602 and a speaker 2. The audio output device 100 is built in the housing 602 to drive the speaker 2.

FIG. 12B is an audio component 700, which is an example of the electronic device. The audio component 700 includes a housing 702 and a speaker 2. The audio output device 100 is built in the housing 702 to drive the speaker 2.

FIG. 12C is a small-sized information terminal 800, which is an example of the electronic device. The small-sized information terminal 800 is a portable telephone, a personal handy-phone system (PHS), a personal digital assistant (PDA), a tablet personal computer (PC), an audio player, or the like. The small-sized information terminal 800 includes a housing 802, a speaker 2, and a display 804. The audio output device 100 is built in the housing 802 to drive the speaker 2.

According to the present disclosure, in some embodiments, it is possible to suppress overshoot of output of an audio amplifier circuit of a class D type.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An audio amplifier circuit for driving an electro-acoustic transducer, which is bridged transless (BTL)-connected to the audio amplifier circuit, in a filterless manner, comprising:
 a class D amplifier including a high side transistor and a low side transistor, the low side transistor being divided into n transistor areas, which have control terminals, respectively, n being an integer greater than 1;
 a high side driver configured to drive the high side transistor based on a first voltage between an output voltage and a boot strap voltage which is a combination of the output voltage and a predetermined voltage;
 a low side driver configured to drive the low side transistor based on a second voltage between the predetermined voltage and a ground, as a pair; and
 a delay circuit including n−1 delay elements connected in series, each delay element being configured to receive a signal and delay a negative edge of the received signal, a first delay element being connected to the low side driver to receive a control signal,
 wherein the control signal is applied to a control terminal of a first transistor area among the n transistor areas, and an output of an i−1$_{th}$ delay element among the n−1 delay elements is applied to a control terminal of an i$_{th}$ transistor area among the n transistor areas, i being an integer greater than 1 and equal to or smaller than n,
 wherein the low side driver is configured to output the control signal to sequentially turn off the n transistor areas via the delay circuit so that a first off time for turning off the low side transistor by the low side driver is longer than a second off time for turning off the high side transistor by the high side driver,
 wherein a first on time for turning on the low side transistor by the low side driver does not overlap with the second off time, and wherein a second on time for turning on the high side transistor by the high side driver is within the first off time.

2. The circuit of claim 1, wherein each of the high side transistor and the low side transistor is an NMOS transistor,
 the high side transistor includes a first P-type Metal-Oxide-Semiconductor (PMOS) transistor and a first N-type Metal-Oxide-Semiconductor (NMOS) transistor,
 the low side transistor includes a second P-type Metal-Oxide-Semiconductor (PMOS) transistor and a second N-type Metal-Oxide-Semiconductor (NMOS) transistor, and
 an on-resistance of the second N-type Metal-Oxide-Semiconductor (NMOS) transistor is higher than that of the first N-type Metal-Oxide-Semiconductor (NMOS) transistor.

3. The circuit of claim 2, wherein the on-resistance of the second N-type Metal-Oxide-Semiconductor (NMOS) transistor is 1.2 to 2 times that of the first N-type Metal-Oxide-Semiconductor (NMOS) transistor.

4. The circuit of claim 1, wherein the circuit is integrated in a single semiconductor substrate.

5. An audio amplifier circuit for driving an electro-acoustic transducer, which is bridged transless (BTL)-connected to the audio amplifier circuit, in a filterless manner, comprising:
 a class D amplifier including a high side transistor and a low side transistor, the low side transistor being divided into n transistor areas, which have control terminals, respectively, n being an integer greater than 1;
 a high side driver configured to drive the high side transistor based on a first voltage between an output voltage and a boot strap voltage which is a combination of the output voltage and a predetermined voltage;
 a low side driver configured to drive the low side transistor based on a second voltage between the predetermined voltage and a ground, as a pair; and
 a delay circuit including n−1 delay elements connected in series, each delay element being configured to receive a signal and delay a negative edge of the received signal, a first delay element being connected to the low side driver to receive a control signal,
 wherein the control signal is applied to a control terminal of a first transistor area among the n transistor areas, and an output of an i−1$_{th}$ delay element among the n−1 delay elements is applied to a control terminal of an i$_{th}$ transistor area among the n transistor areas, i being an integer greater than 1 and equal to or smaller than n,
 wherein the low side driver is configured to output the control signal to sequentially turn off the n transistor areas via the delay circuit so that a first off time for turning off the low side transistor by the low side driver is longer than a first on time for turning on the low side transistor,
 wherein the first on time does not overlap with a second off time for turning off the high side transistor by the high side driver, and
 wherein a second on time for turning on the high side transistor by the high side driver is within the first off time.

6. The circuit of claim 5, wherein the low side transistor includes a P-type Metal-Oxide-Semiconductor (PMOS) transistor and a N-type Metal-Oxide-Semiconductor (NMOS) transistor, and an on-resistance of the N-type Metal-Oxide-Semiconductor (NMOS) transistor is higher than that of the P-type Metal-Oxide-Semiconductor (PMOS) transistor.

7. The circuit of claim 6, wherein the on-resistance of the N-type Metal-Oxide-Semiconductor (NMOS) transistor is 1.2 to 2 times that of the P-type Metal-Oxide-Semiconductor (PMOS) transistor.

8. An audio amplifier circuit for driving an electro-acoustic transducer, which is bridged transless (BTL)-connected to the audio amplifier circuit, in a filterless manner, comprising:

a pair of class D amplifiers, each of the class D amplifiers including a high side transistor and a low side transistor, the low side transistor being divided into n transistor areas, which have control terminals, respectively, n being an integer greater than 1;

a high side driver configured to drive the high side transistor based on a first voltage between an output voltage and a boot strap voltage which is a combination of the output voltage and a predetermined voltage; and a low side driver configured to drive the low side transistor based on a second voltage between the predetermined voltage and a ground, as a pair; and a delay circuit including n−1 delay elements connected in series, each delay element being configured to receive a signal and delay a negative edge of the received signal, a first delay element being connected to the low side driver to receive a control signal, wherein the control signal is applied to a control terminal of a first transistor area among the n transistor areas, and an output of an i−1$_{th}$ delay element among the n−1 delay elements is applied to a control terminal of an i$_{th}$ transistor area among the n transistor areas, i being an integer greater than 1 and equal to or smaller than n, wherein at least a part of the n transistor areas are sequentially turned off via the delay circuit during a period when a current flows in a parasitic capacitance connected to the high side transistor and the low side transistor, wherein a first on time for turning on the low side transistor by the low side driver does not overlap with a second off time for turning off the high side transistor by the high side driver, and wherein a second on time for turning on the high side transistor by the high side driver is within a first off time for turning off the low side transistor by the low side driver.

9. An audio output device, comprising:

an electro-acoustic transducer; and the audio amplifier circuit of claim 1, configured to drive the electro-acoustic transducer, wherein no snubber circuit is connected between the audio amplifier circuit and the electro-acoustic transducer.

10. An electronic device, comprising:

an electro-acoustic transducer; and the audio amplifier circuit of claim 1, configured to drive the electro-acoustic transducer, wherein no snubber circuit is connected between the audio amplifier circuit and the electro-acoustic transducer.

* * * * *